United States Patent [19]
Batten, Jr. et al.

[11] Patent Number: 6,028,775
[45] Date of Patent: Feb. 22, 2000

[54] ASSEMBLIES OF ELECTRONIC DEVICES AND FLEXIBLE CONTAINERS THEREOF

[75] Inventors: L. Eugene Batten, Jr., Angier; Dennis A. McCulloch, Chapel Hill; Amit Chawla, Cary, all of N.C.

[73] Assignee: Nortel Networks Corporation, Montreal, Canada

[21] Appl. No.: 08/989,813

[22] Filed: Dec. 12, 1997

[51] Int. Cl.[7] ................................................. H05K 9/00
[52] U.S. Cl. ..................... 361/816; 361/752; 361/796; 361/799; 361/800; 174/35 R; 174/35 GC; 439/67; 439/76.1
[58] Field of Search ..................................... 361/816, 800, 361/818, 799, 824, 398.3, 398.4, 734, 736, 746; 174/35 R, 35 GC; 439/67, 76.1

[56] References Cited

U.S. PATENT DOCUMENTS

| | | | |
|---|---|---|---|
| 4,800,461 | 1/1989 | Dixon et al. | 361/398 |
| 5,527,989 | 6/1996 | Leeb | 174/35 GC |
| 5,545,494 | 8/1996 | Trumble et al. | 429/163 |

*Primary Examiner*—Leo P. Picard
*Assistant Examiner*—Tuan Dinh
*Attorney, Agent, or Firm*—Foley & Lardner

[57] ABSTRACT

An assembly of an electronic device inside a flexible container in which the device is held within a sealed chamber of the container. The electronic device, which may be a printed circuit board, has signal terminals which are connected to elongate insulated signal conductors. These conductors pass through a laminate construction wall of the container for connection to outside electrical conductors. The signal conductors are electrically isolated from an EMI protection layer which forms part of the laminate construction wall. A grounding device includes a ground element electrically connected to a ground conductor of the electronic device, the ground element being secured to the inside surface of the container provided by a dielectric inner layer. The ground element is thus in capacitive coupling with the EMI protection layer. A further ground element may be disposed on the outside of the container and separated from the EMI protection layer by an outer dielectric layer to provide a further capacitive coupling.

11 Claims, 3 Drawing Sheets

ASSEMBLIES OF ELECTRONIC DEVICES AND FLEXIBLE CONTAINERS THEREOF

This invention relates to electronic devices within flexible containers.

In the electronics industry, electronic devices, e.g. printed circuit boards, are conventionally incorporated into equipment. Depending upon the usage of printed circuit boards particularly, it may be required to prevent electromagnetic radiation from passing to or from electronic components mounted upon the boards because of the electromagnetic interference (EMI) which results. Up to the present time it has been conventional practice to provide EMI shielding around an entire printed circuit board by housing the printed circuit board with a conductive rigid metal shield forming part of an assembly with the printed circuit board. The metal shield is grounded to provide the required EMI protection. An electrical connector is necessary to connect the printed circuit board with electrical equipment or a power source exteriorly of the shield. Conventional arrangements have proved to be unsatisfactorily expensive, occupy an inordinately large spacial volume as compared to the volume of the printed circuit board and its electronic component, and require many manufacturing steps.

In an effort to overcome the above problems, a U.S. Pat. No. 5,545,494 to W. P. Trumble et al, describes an assembly of printed circuit board and a flexible container around the board and in which EMI protection is provided by a conductive flexible metal layer as an inner layer of the container wall. The container has an opening within which a connector of the board is mounted with the opening to the container being sealed around a peripheral surface of the body of the connector. Not only is EMI protection provided, but also the inside of the container and thus the printed circuit board and its electronic components are protected from dust and any other airborne contamination. The problem with the construction described in the above Patent is that the connector body needs to be sufficiently large in size for the container to seal around it at the container opening. A body of this size is much larger than would otherwise be necessary merely to be mounted upon a printed circuit board for conveying signals to and from the board. The structure is therefore cumbersome.

The present invention seeks to provide a solution to the above problems in connecting an electronic device within a flexible container to external electrical means and also to provide an efficient ground for the electrical device.

Accordingly, the present invention provides an assembly of a flexible container and an electronic device comprising: a flexible container defining a chamber and comprising a laminate construction wall which includes a dielectric layer facing inwardly into the chamber and an EMI protection layer surrounding the dielectric layer; an electronic device located within the chamber and having a plurality of signal terminals; a plurality of elongate signal conductors each extending from an individual signal terminal through the laminate construction wall for connection to electrical means outside the container; and a grounding device which comprises a ground element electrically connected to a ground conductor of the electronic device and secured to the laminate construction wall at a fixed distance from the EMI protection layer to provided a capacitive coupling with the EMI protection layer.

With the above assembly according to the invention, a hermetically sealed flexible container may be simply provided and having a grounding, possibly for radio frequencies and while being able to achieve an acceptable EMI shield.

In preferred constructions according to the invention, the ground element comprises an electrically conductive layer within the chamber which is spaced from the EMI protection layer by the dielectric layer facing inwardly into the chamber.

The EMI protection layer may be grounded, in use, in any desirable manner. This includes the use of a ground wire electrically connected directly to the EMI protection layer, or a toothed ground clamp grippping onto a seamed region of the container with the teeth passing in gastight contact into the EMI protection layer. In one preferred arrangement for grounding the EMI protection layer, a further dielectric layer is provided and which surrounds the EMI protection layer, and the grounding device further comprises a further electrically conductive element secured on the outside of the container. This further electrically conductive element is separated a fixed distance from the EMI protection layer by at least the thickness of the further dielectric layer so as to provide a further capacitive coupling with the EMI protection layer.

In a further preferred arrangement, the electrically conductive layer within the chamber is carried upon a surface of the electronic device and is sandwiched between the surface of the electronic device and the dielectric layer which faces inwardly into the chamber. With such an arrangement, a ground wire is not required to connect a ground conductor of the electronic device to the ground element such as would be the case if the ground element were not mounted upon the electronic device but was separate from it.

Where the electrically conductive layer is carried upon a surface of the electronic device, then the electronic device and the electrically conductive layer may be sandwiched together between, and bonded to, confronting inner surface oarts of the dielectric layer which faces inwardly into the chamber. Alternatively, the electrically conductive layer while being carried upon the surface of the electronic device, extends outwardly therefrom to be bonded between the confronting inner surfaces of that dielectric layer.

Embodiments of the invention will now be described, by way of example, with reference to the accompanying drawings, in which.

Figure 3:
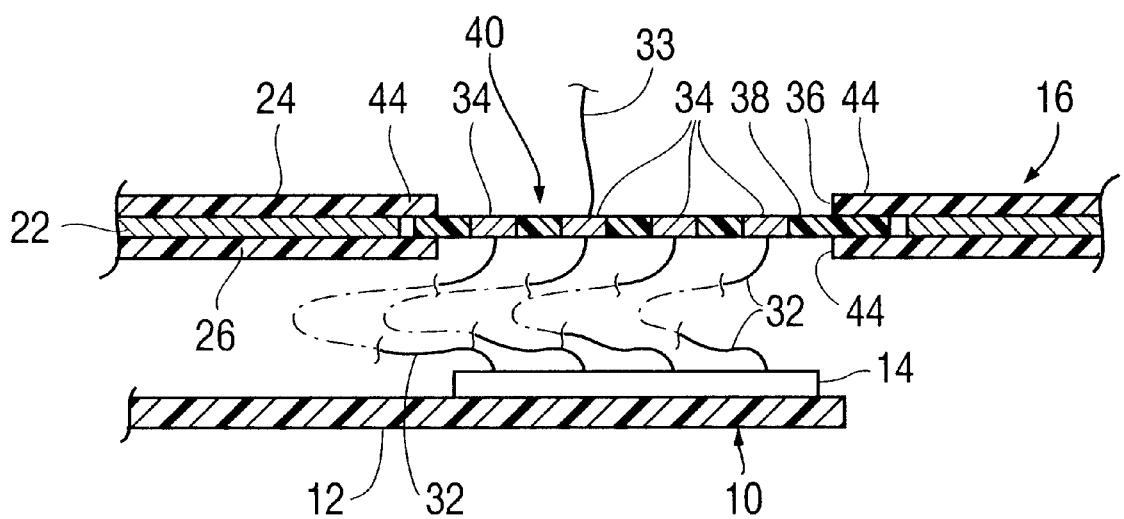
FIG. 3 is a view similar to FIG. 2 of another part of the assembly of the first embodiment.
Figure 5:
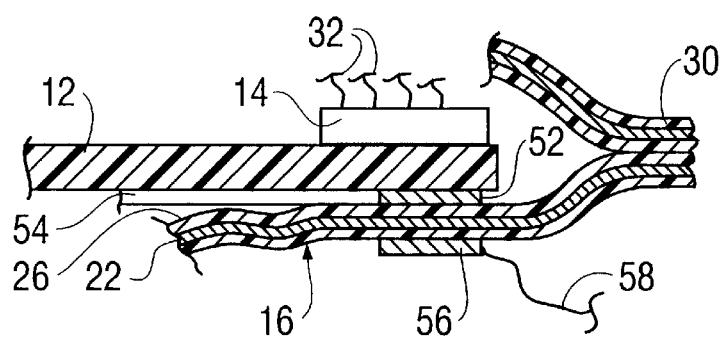
FIG. 5 is a view similar to FIG. 2 of another part of the assembly of the first embodiment.
Figure 6:
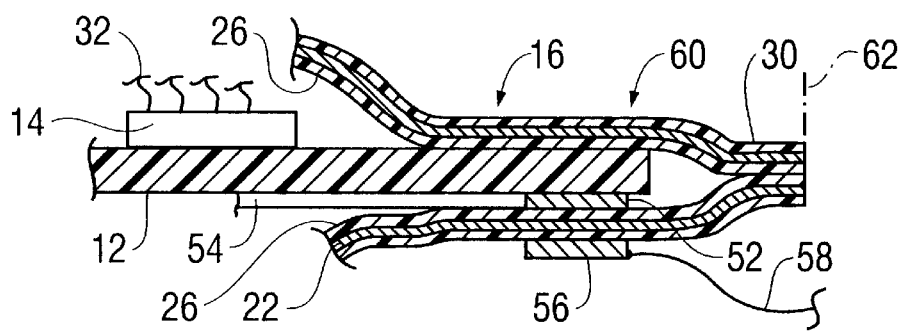
Figure 7:
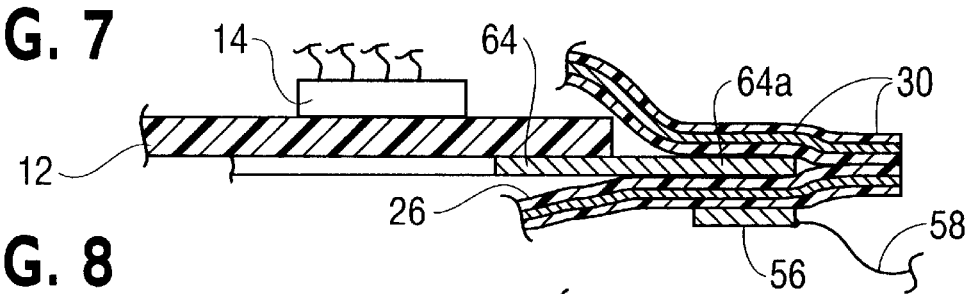
Figure 8:
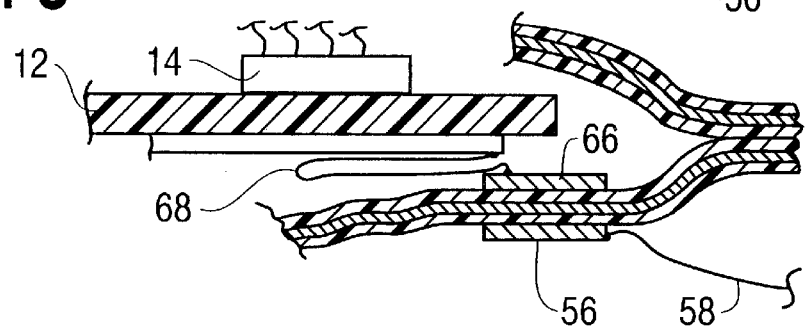
Figure 9:
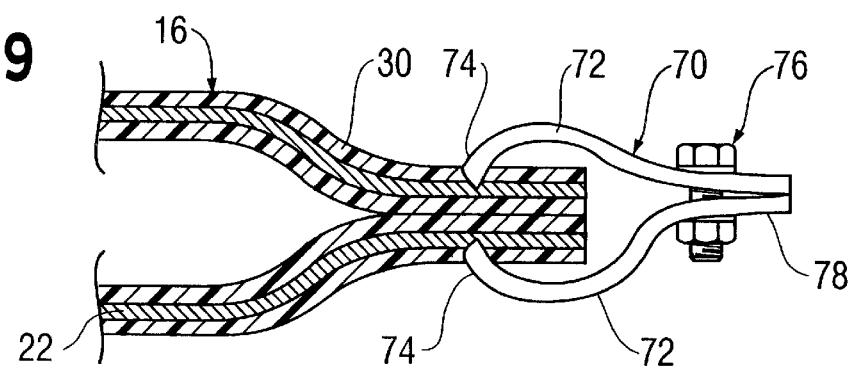
Figure 10:
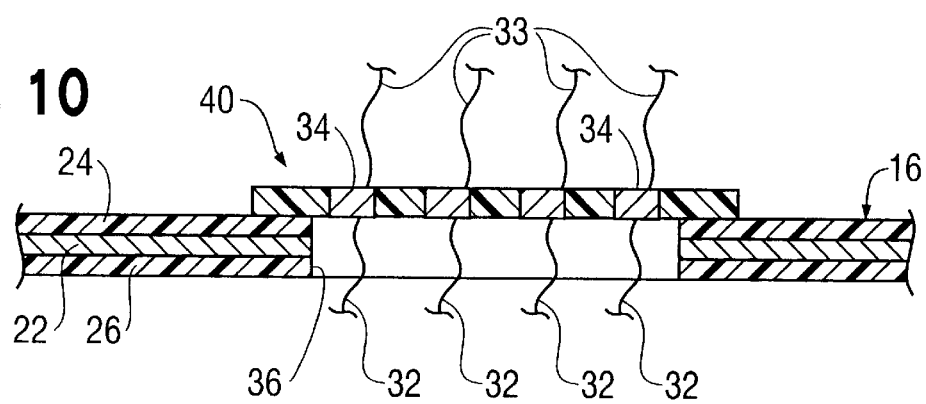
Figure 11:
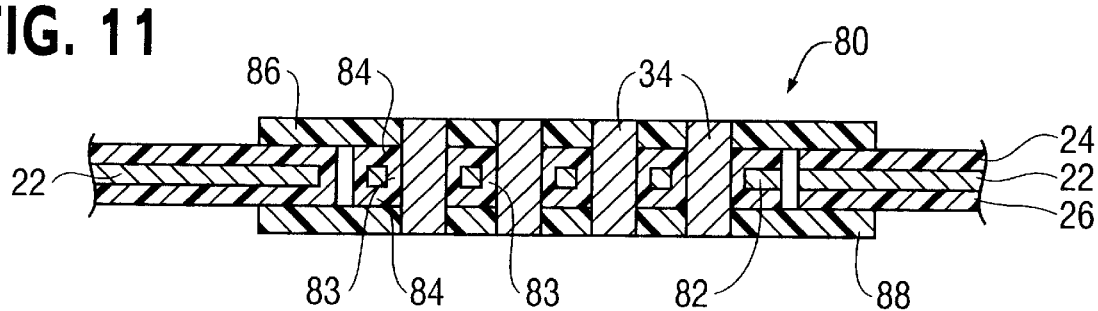
Figure 12:
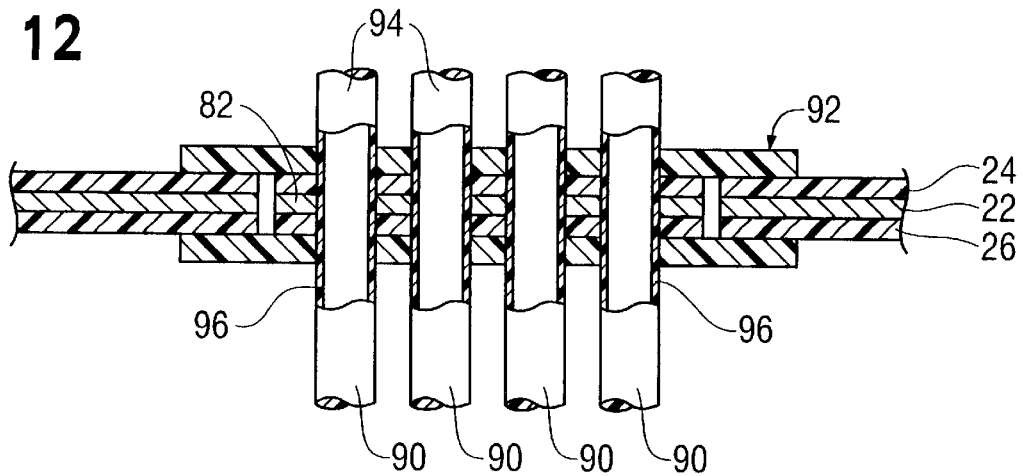

FIGS. 6, 7, and 8 are views similar to FIG. 5 of second, third and fourth embodiments respectively;

FIG. 9 is a view similar to FIG. 3 and showing another manner of grounding an EMI protection layer of the flexible container according to any of the first to fourth embodiments; and FIGS. 10, 11 and 12 are modifications to any of the first to fourth embodiments.

Figure 1:
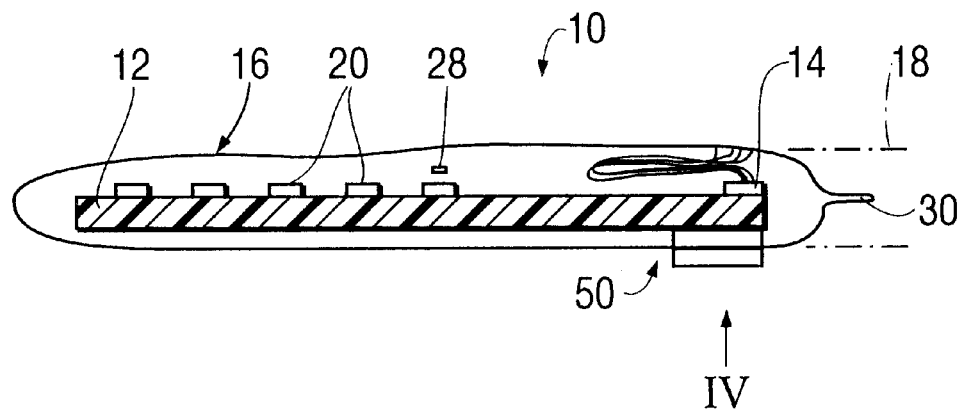
FIG. 1 is a side elevational diagrammatic view in cross-section of an assembly of an electronic device in the form of a printed circuit board disposed within a flexible container, and according to a first embodiment.
Figure 2:
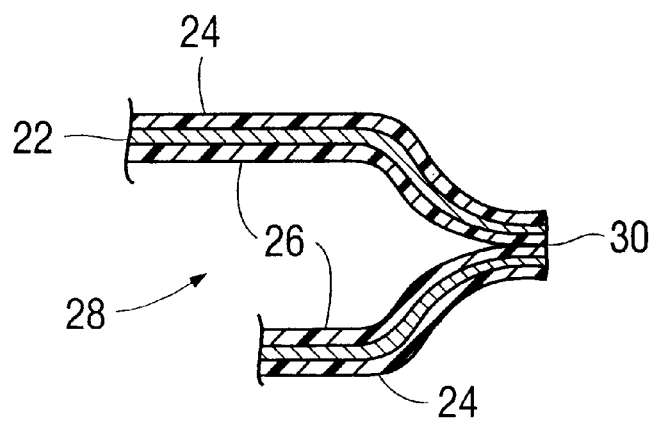
FIG. 2 is a cross-sectional view similar to FIG. 1, but to a larger scale, of part of the assembly of the first embodiment.

In a first embodiment as shown in FIG. 1, an assembly 10 of a printed circuit board and flexible container comprises a printed circuit board 12 of conventional construction, the printed circuit board having an elongate electrical connector 14 connected along one edge region of the board in conventional manner. A flexible container 16 of the assembly is manufactured with an open 18 (shown in chain-dotted in FIG. 1) and into which the printed circuit board 12 and accompanying connector 14 has been inserted as a subassembly. The container 16 is of laminate construction wall and requires an EMI protection layer for the purpose of preventing or substantially diminishing the amount of magnetic radiation penetrating the container either to or from electronic components 20 mounted upon the printed circuit board. For this, as shown in FIGS. 2 and 3, a thin metal layer 22 (e.g. copper or other suitable conductive material) is provided intermediate inner and outer layers of the container. The layer 22 may be of any desired thickness while being suitable for its desired purpose. It is found that a thickness down to 0.5 mil will suffice. The layer 22 is also imperforate and thus also serves as a moisture or other fluid barrier through the wall of the container. Alternatively, the layer 22 is perforate while still satisfying its EMI protection requirements and a specific moisture impermeable layer (not shown) is then included in the container. This specific layer may, for instance, be made from polyvinylidene chloride, such as sold under the trade name "Saran". An outer layer 24 is required to provide strength to the container and also to have abrasion and cutting resistance. In addition, it should also have dielectric properties. Any suitable polymeric material may do for this purpose, e.g. polyethyleneterephthalate, possibly sold under the trade name "Mylar". Other materials are also suitable including polypropylene or polyamide. The outer layer is of a desired thickness to provide required flexibility. A thickness of at least 1 mil is found suitable.

An inner layer 26 which faces inwardly into a chamber 28 within the container needs also to be of dielectric material. This is basically to prevent shorting of circuitry on the printed circuit board should the container contact any surface of the board or contact any electrical conductor carried by the board. With the particular requirements of the container, it is also necessary for the material of the inner layer to be such that it will fuse and heatseal to itself. A suitable material, and as used in this embodiment, is polyethylene. As shown in FIGS. 1 and 2, marginal edge regions 30 of the container 16 at the opening 18 have been brought together with inside surfaces provided by the polyethylene inner layer 26 abutted and then heatsealed together. An airtight seal along the fused together marginal edge regions 30 is thus provided thereby airtightly sealing the chamber 28 within the container from the outside environment.

The printed circuit board 12 communicates electrically with equipment exteriorly of the container 16 by means of a plurality of individually insulated signal conductors which extend from signal terminals of the connector 14 to present ends facing outwardly from the container for connection to the electrical equipment exteriorly of the container. In this particular embodiment, these individually insulated signal conductors comprise a plurality of individually insulated conductor wires 32 (see FIGS. 1 and 3) which extend from the signal terminals at the connector 14 and are soldered to electrically conductive elements 34 which are carried by the wall of the container as will now be described.

As already indicated, the wall of the container is a laminate construction wall comprising the three layers 22, 24 and 26. However, in this embodiment, the laminate construction wall is formed with an elongate aperture 36 (see FIG. 3) which preferably overlies the position of the connector 14. The aperture 36 is bridged and sealingly closed by a carrier 38 of a preformed assembly 40 of the carrier and the electrically conductive elements 34. The carrier 38 is a single layer of a dielectric material, e.g.

polyethylene, polypropylene or polyamide for instance, which may be bonded or heatsealed to either or both of the inner and outer layers 24, 26, of the laminate construction wall. The dielectric material of the carrier 38 holds the electrically conductive elements 34 spaced apart and electrically isolated from each other and, conveniently, these elements are relatively positioned in a pattern which corresponds to the pattern of the terminals in the connector 14 from which the conductor wires 32 extend. Thus, each of the elements 34 has an end facing inwardly into the container 16 which is connected to a corresponding conductor wire 32, and an end which faces outwardly from the container and is exposed for soldering to another insulated conductor wire, e.g. as shown as item 33 in FIG. 3, and which extends to the other electrical equipment. The aperture 36, as shown by FIG. 3, has marginal regions provided by aperture defining dielectric projections 44 of the layers 24 and 26 and which project outwardly beyond the EMI protection layer. The carrier 38 is inserted between the projections 44 and is bonded or heatsealed thereto as required to seal across the aperture.

Figure 4:
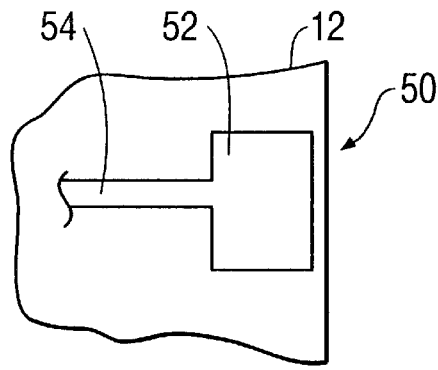
FIG. 4 is a view in the direction of arrow 1V in FIG. 1 of part of the structure and to a larger scale than in FIG. 1.

In addition, the first embodiment includes a grounding device 50 for electrically connecting a ground conductor of the printed circuit board to the EMI protection layer 22. As shown in FIGS. 1, 4 and 5, the grounding device 50 comprises a ground element in the form of an electrically conductive layer 52 which is carried upon and forms part of the circuitry on the printed circuit board 12. The electrically conductive layer 52 is on a side of the board otherwise devoid of surface circuitry or components and is connected into a ground plane of the board by an electrical conductor path 54. The electrically conductive layer 52 is bonded to the inner surface of the dielectric layer 26 as shown by FIG. 5. This locates the layer 52 in a fixed position and distance from the EMI protection layer 22 so as to provide a capacitive coupling with the EMI protection layer. The electrically conductive layer 52 has a surface area of such size to provide the desired coupling effect with the EMI protection layer for grounding certain frequencies emanating from the board or from components mounted thereon, e.g. certain radio frequencies. While the shape of the layer 52 in plan may be any desired, in this embodiment it is conveniently formed as rectangular. In effect therefore, the printed circuit board 12 is bonded directly to the laminate construction wall of the container through the layer 52. Also as shown in FIG. 5, conveniently for ease of securement, the layer 52 is disposed at an end of the printed circuit board 12 so as to be close to the open end 18 of the container for ease of access for bonding purposes before the container end is sealed.

In conjunction with the capacitive coupling provided between the layer 52 and the EMI protection layer 22, a further capacitive coupling is provided to complete grounding of the layer 52 and of the EMI protection layer. This is achieved by the location on the outside of the container, of a further electrically conductive layer 56, which may also be rectangular or square in plan view if required. This layer 56 is bonded to the outside surface of the container and is separated from the EMI protection layer by the dielectric layer 24 so as to achieve the desired capacitive coupling effect. A ground wire 58 extends from the layer 56 to be grounded in suitable manner when the assembly 10 is in use.

As may be seen from the above embodiment, and also from other embodiments to follow, the capacitive grounding coupling provided according to the invention is an extremely convenient manner for providing grounding both to the electronic device within the container and also to the EMI protection layer in a case where the container 16 is hermetically sealed as in these embodiments.

In second, third and fourth embodiments now to be described, features of these embodiments similar to features in the first embodiment carry the same reference numerals.

In a second embodiment with reference to FIG. 6, the construction of an assembly 60 of a printed circuit board 12 and flexible container 16 is similar to that described in the first embodiment except in the manner of securing the electrically conductive layer 52 to the laminate construction wall. In the case of the second embodiment, the printed circuit board 12 is positioned closer to the sealed edge 62 of the container so as to lie within the sealed and fused marginal edge regions 30. These marginal edge regions 30 in the second embodiment are wider than in the first embodiment and extend both across the adjacent edge of the board 12 and the electrically conductive layer 52 so that the adjacent edge of the board and the layer 52 is sandwiched between and bonded to, confronting inner surface parts of the dielectric layer 26.

In a third embodiment, as shown by FIG. 7, the electrical conductive layer 52 is replaced by another electrically conductive layer 64. This layer 64 is mounted to an edge region of the printed circuit board 12 an extends outwardly from that edge region to provide an outwards projection 64a. This outwards projection is sandwiched between the confronting inner surface parts of the layer 26 and is bonded thereto in the marginal edge regions 30.

In a fourth embodiment in which an electrically conductive layer of the grounding device is not mounted upon the printed circuit board 12, a ground element of the device comprises an electrically conductive layer 66. This layer 66 is bonded to the inner surface of the laminate construction wall of the container in a position spaced from the printed circuit board 12. A ground wire 68 extends from the ground conductor path 54 of the printed circuit board to the electrically conductive layer 66. The layer 66 thus lies in a capacitive coupling position with the EMI protection layer 22 for grounding purposes, and a further electrically conductive layer 56 is again provided on the outside of the container.

In the above embodiments one to four, while the electrically conductive layer 56 is described for providing a capacitive coupling with the EMI protection layer for grounding purposes, alternative grounding arrangements may be provided on the outside of the container. For instance, in another method of providing a ground for the EMI protection layer 22 (FIG. 9), a jaw clamp 70 is clamped onto the closed end 30 of the container, the jaw clamp having two opposing jaws 72 each provided with cutting teeth 74. A clamping nut and bolt assembly 76 draws the jaws into a clamping position so that the teeth at each side pass into the closed end 30 of the container and through the EMI protection layer 22 to form a gastight electrical connection with that layer. The jaw clamp 70 is then connected by a ground wire 78 to ground.

The above described embodiments have been discussed with reference to the use of the carrier 38 having the conductive elements 34 for conveying electrical signals through the laminate construction wall to and from the printed circuit board. However, other constructions for effectively conveying signals through the wall may also be used. Such constructions are described in the co-pending U.S. Patent Application referred to above (Applicants' reference RN 1062). For instance, in modifications of any of the above three described embodiments, constructions for passing signals through the laminate construction wall may be as follows.

In a first modification of any of the above embodiments, and as shown by FIG. 10, the carrier 38 is bonded to the outside surface of the container 16, i.e. the outside surface of the layer 24, and the aperture 36 may be of the same size and dimensions right through the laminate construction wall without the projections 44 being provided.

In a second modification as shown by FIG. 11, a carrier 80 comprises an EMI protection layer 82 which may be of the same material of the layer 22 and of a similar thickness. On either side of the EMI protection layer 82 is provided a dielectric layer 84 of any suitable polymeric material. Each layer is of suitable size and shape to fit within the aperture 36. An outer layer 86 which projects from the layer 84 in all radial directions, overlaps the marginal regions of the aperture provided by layer 24 and is bonded to the layer 24. The layer 86 may be of the same material as the layer 24. An inner layer 88 of similar dimensions to the layer 86 overlaps the inner layer 26. The layer 88 is conveniently of the same material as the layer 26 and is heatsealed thereto. As may be seen from the construction of the third embodiment, the EMI protection layer 82 would prevent EMI radiation from the area provided by the aperture 36 with the carrier 80 in position in the finished assembly. The EMI protection layer 82 has clearance holes 83 for spacing from the conductive elements 34 and dielectric polymeric material lying within the clearance holes electrically isolates the elements 34 from the layer 82.

In a third modification as shown by FIG. 12, electrical signals are conveyed to and from the printed circuit board 12 by individually electrically insulated conductor wires 90 which pass from the board 12 through the chamber 28 and out to the outside environment. These wires 90 pass through a carrier 92 which is molded around the wires so that end regions 94 of the conductor wires project exteriorly of the container in the finished assembly for connection to other electrical equipment. As also shown by FIG. 12, the carrier 92 may be of basically the same construction as the carrier 80 in the second modification described above, but, in the third modification, the EMI protection layer 82 is separated from each of the conductor wires 90 by an insulation layer 96 on each of the wires.

What is claimed is:

1. An assembly of a flexible container and an electronic device comprising:

a flexible container defining a chamber and comprising a laminate construction wall which includes a dielectric layer facing inwardly into the chamber and an EMI protection layer surrounding the dielectric layer;

an electronic device located within the chamber and having a plurality of signal terminals for the device;

a plurality of elongate signal conductors each extending from an individual signal terminal through the laminate construction wall for connection to electrical means outside the container, and the signal terminals being electrically isolated from the EMI protection layer; and a grounding device which comprises a ground element electrically connected to a ground conductor of the electronic device and secured to the laminate construction wall at a fixed distance from the EMI protection layer to provide a capacitive coupling with the EMI protection layer.

2. An assembly according to claim 1 wherein the electronic device is hermetically sealed within the container.

3. An assembly according to claim 1 wherein the ground element comprises an electrically conductive layer located within the chamber and spaced from the EMI protection layer by the dielectric layer facing inwardly into the chamber.

4. An assembly according to claim 3 wherein the flexible container comprises a further dielectric layer which surrounds the EMI protection layer, and the grounding device also comprises a further electrically conductive layer secured on the outside of the container and in separated and in fixed distance relationship from the EMI protection layer by at least the thickness of the further dielectric layer so as to provide a further capacitive coupling with the EMI protection layer.

5. An assembly according to claim 3 wherein the electrically conductive layer within the chamber is carried upon a surface of the electronic device and is sandwiched between that surface and the dielectric layer which faces inwardly into the chamber.

6. An assembly according to claim 5 wherein the flexible container comprises a further dielectric layer which surrounds the EMI protection layer, and the grounding device also comprises a further electrically conductive element secured to the outside of the container and in separated and fixed distance relationship from the EMI protection layer by at least the thickness of the further dielectric layer so as to provide a further capacitive coupling with the EMI protection layer.

7. An assembly according to claim 5 wherein the electrically conductive layer carried upon the electronic device, extends outwardly from the electronic device and is sandwiched and bonded between confronting inner surface parts of the dielectric layer facing inwardly into the chamber.

8. An assembly according to claim 5 wherein a region of the electronic device carrying the electrically conductive layer is sandwiched, together with the electrically conductive layer, and is bonded between confronting inner surface parts of the dielectric layer facing inwardly into the chamber.

9. An assembly according to claim 5 wherein the electrically conductive layer which is carried by the electronic device is bonded to the dielectric layer facing inwardly into the chamber at a position adjacent to a sealed end of the container.

10. An assembly according to claim 8 wherein the electrically conductive layer which is carried upon the electronic device, is sandwiched and bonded between confronting inner surface parts of the dielectric layer at a sealed end region of the container.

11. An assembly according to claim 3 wherein the electrically conductive layer is connected to the ground conductor of the electronic device by a ground wire extending from the electronic device to the electrically conductive layer.

* * * * *